(12) United States Patent
Chan

(10) Patent No.: US 6,484,393 B1
(45) Date of Patent: Nov. 26, 2002

(54) METHOD FOR WIRE BONDING TO FLEXIBLE SUBSTRATES

(75) Inventor: Alex B. Chan, Peyton, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 739 days.

(21) Appl. No.: 08/956,642

(22) Filed: Oct. 23, 1997

Related U.S. Application Data

(62) Division of application No. 08/408,659, filed on Mar. 21, 1995, now Pat. No. 5,713,563.

(51) Int. Cl.[7] .......................... H05K 3/34; B25B 11/00
(52) U.S. Cl. ...................... 29/840; 29/832; 29/834; 29/DIG. 44; 29/743; 269/21; 269/900; 269/903; 174/260; 174/263
(58) Field of Search ..................... 29/840, 832, 834, 29/760, 743, DIG. 44, 843, 860, 527.2; 269/21, 900, 903, 909; 439/67, 77, 493; 174/255, 260, 263; 228/4.5

(56) References Cited

U.S. PATENT DOCUMENTS

| | | | | | |
|---|---|---|---|---|---|
| 4,211,808 A | * | 7/1980 | Trankle | .................. | 269/21 |
| 4,675,242 A | * | 6/1987 | Hashimoto et al. | ........... | 269/21 |
| 4,790,897 A | * | 12/1988 | Long | ........................ | 29/843 |
| 4,941,255 A | * | 7/1990 | Bull | ............................ | 29/840 |
| 5,007,576 A | * | 4/1991 | Congleton et al. | ............ | 29/843 |
| 5,106,784 A | * | 4/1992 | Bednarz | ..................... | 437/214 |
| 5,455,390 A | * | 10/1995 | DiStefano et al. | ........... | 174/262 |
| 5,525,545 A | * | 6/1996 | Grube et al. | ................. | 437/209 |
| 5,546,654 A | * | 8/1996 | Wojnarowski et al. | . | 29/DIG. 44 |
| 5,638,596 A | * | 6/1997 | McCormick | ................... | 29/827 |
| 5,670,009 A | * | 9/1997 | Tarn et al. | ..................... | 29/743 |
| 5,784,258 A | * | 7/1998 | Quinn | ........................ | 29/743 |
| 5,794,330 A | * | 8/1998 | DiStefano et al. | ............ | 29/840 |
| 5,798,014 A | * | 8/1998 | Weber | ......................... | 29/840 |
| 5,819,394 A | * | 10/1998 | Curtin | ....................... | 29/527.2 |

FOREIGN PATENT DOCUMENTS

| | | | | | |
|---|---|---|---|---|---|
| JP | 404180693 | * | 6/1992 | ................... | 29/840 |
| JP | 405110243 | * | 4/1993 | ................... | 29/840 |
| JP | 6-114664 | * | 4/1994 | ................... | 269/21 |

OTHER PUBLICATIONS

Holding Circuit Part Components for Bonding, IBM Technical Disclosure Bulletin, vol. 13, p. 3046, Mar. 1971.*
Enhanced Thermosonic Wire–Bonding Technique, Research Disclosure, No. 305, p. 30508, Sep. 1989.*

* cited by examiner

Primary Examiner—Peter Vo
Assistant Examiner—A. Dexter Tugbang

(57) ABSTRACT

A method of electrically connecting an electronic component to the flexible printed wiring board may comprise the steps of: Providing an air permeable platen having a substantially flat front surface and a back surface; placing the flexible printed wiring board on the front surface of the platen; lowering the pressure at the back surface of the platen; and electrically connecting the electronic component to the flexible printed wiring board.

5 Claims, 2 Drawing Sheets

METHOD FOR WIRE BONDING TO FLEXIBLE SUBSTRATES

CROSS-REFERENCE TO RELATED APPLICATION

This is a division of U.S patent application Ser. No. 08/408,659, filed on Mar. 21, 1995, now U.S. Pat. No. 5,713,563, which is incorporated herein by reference for all that it discloses.

FIELD OF THE INVENTION

This invention relates to the electrical interconnection of electronic components in general and more specifically to a method for wire bonding electronic components to flexible printed wiring boards.

BACKGROUND

Flexible printed wiring boards or flex boards are generally used to transmit electrical signals between electronic devices that are moveable with respect to one another. For example, flex boards may be used to transmit electrical signals from the central processing board or "mother board" of a laptop computer to the display screen. A typical flex board may comprise one or more layers of metal circuit paths or conductors that are bonded onto a thin, flexible, insulating substrate. The circuit paths or conductors are commonly thin copper strips and the flexible, insulating substrate typically comprises a polyimide material, although other materials may be used. Depending on the complexity of the electronic circuit, the flex board may be single sided, double sided, or may comprise multiple layers of circuit paths or conductors, as in a multi-layer flex board.

Traditionally, flex boards of the type described above did not include any electronic components and merely served as a means to interconnect the electronic components mounted to various rigid printed wiring boards. However, recent developments in flex board technology have allowed such flex boards to support some kinds of electronic components, thus allowing them to be substituted for conventional rigid boards in certain types of circuits. Of course, the ability to replace conventional rigid printed wiring boards with flex boards creates many new design opportunities for electronic devices.

One common method of mounting electronic components, such as integrated circuits (ICs), to flex boards is to solder them directly to the copper conductors on the flex board; the soldered connection providing not only the required electrical connection, but mechanical support as well. Unfortunately, however, the soldering process is not without its disadvantages, and limitations on the maximum density of electrical connections limits the maximum miniaturization that can be achieved with soldering.

One technology that does allow for high density electrical connections is wire bonding. While several variations exist, the basic wire bonding process begins by firmly attaching the back side of the electronic component, usually an integrated circuit (IC), onto the substrate using either an organic adhesive, a glass, or a metal-alloy reflow process. Once the IC is attached to the substrate, it is electrically connected to the various circuit conductors on the board by a plurality of fine wires. The wires are bonded or welded, one at a time, to the pads on the IC and on the board using a special tool, such as a wedge or a capillary, and a combination of heat, pressure, and/or ultrasonic energy.

Although wire bonding to rigid boards was originally done manually, with the operator's skill controlling every aspect of the bonding process, it has progressed rapidly to a fully automated process as the density of IC interconnections has increased. In the automated wire bonding process, an automatic wire bonding machine senses the locations of the bonding pads on both the IC and the board and then automatically connects the appropriate pads with the fine wire. Such automated wire bonding processes are well-developed and have kept pace with the ever increasing number of connections required as well as shrinking bonding pad size. For example, it is not uncommon to bond ICs requiring 300 connections and having two rows of alternating perimeter bonding pads with pad sizes as small as 50×50 $\mu$m (2×2 mils) with 100 $\mu$m (4 mils) between on-row pad centers.

Obviously, such high density wire bonding requires very accurate placement of the IC on the board and requires that the board itself be accurately aligned with respect to the wire bonding machine. While such problems have been addressed and solved with respect to rigid substrates or boards, considerable problems remain with respect to flex boards. For example, flex boards by their nature provide little mechanical support for the electronic components, which makes it difficult to securely hold the flex board with respect to the wire bonding machine during the wire bonding process. Another problem is that the thin flex boards tend to lift or wrinkle when placed on a flat surface, thus making it extremely difficult, if not impossible, for the wire bonding machine to make the necessary wire bond connections.

One method that has been tried to securely hold the flex board in fixed relation to the automated wire bonding machine, and to hold it flat, has been to use double sided adhesive tape to secure the back side of the flex board to a suitable flat support platen. While the double sided tape solves the problem of securely holding the flex board flat with respect to the wire bonding machine, it is difficult to remove the double sided adhesive tape after the wire bonding process without damaging the delicate wire bonds or the flex board itself. Also, such a process does not readily lend itself to automated production techniques.

Consequently, there remains a need for an apparatus and a method for electrically connecting electronic components to a thin, flexible wiring board. While it would be preferable to use a wire bonding process to electrically connect the components to the board, the problems heretofore associated with accurately locating the flex board with respect to the wire bonding machine, as well as holding it flat, must be solved.

SUMMARY OF THE INVENTION

A method of electrically connecting an electronic component to the flexible printed wiring board may comprise the steps of: Providing an air permeable platen having a substantially flat front surface and a back surface; placing the flexible printed wiring board on the front surface of the platen; lowering the pressure at the back surface of the platen; and electrically connecting the electronic component to the flexible printed wiring board.

A significant advantage of the present invention is that it provides a means for securely holding the flex board with respect to the wire bonding machine without the need to resort to adhesives, with all their associated disadvantages. Another advantage is that the air permeable platen provides a solid support surface for the flex board while at the same time allowing more evenly distributed external air pressure to hold the flex board flat against the front surface of the air permeable platen.

BRIEF DESCRIPTION OF THE DRAWING

Illustrative and presently preferred embodiments of the invention are shown in the accompanying drawing in which.

DETAILED DESCRIPTION OF THE INVENTION

Figure 1:
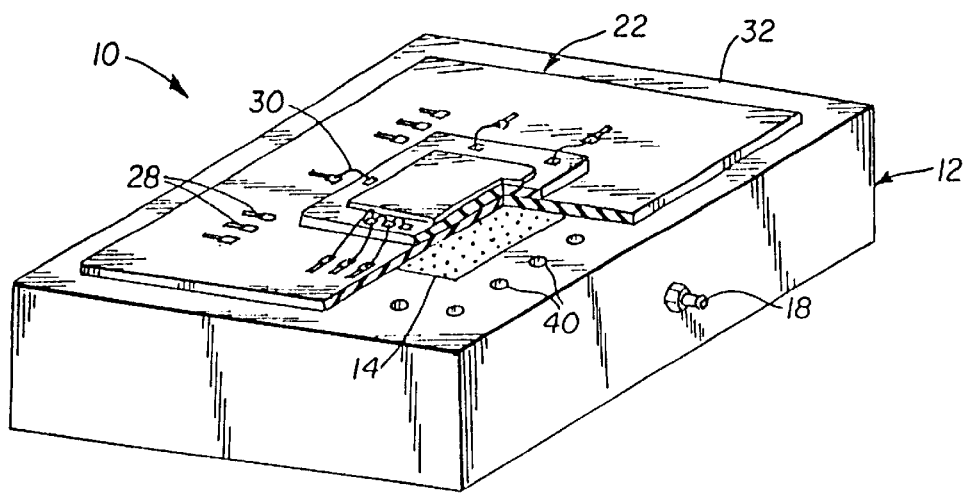
FIG. 1 is a perspective view of the apparatus for releasibly securing a flexible printed wiring board in preparation for a wire bonding process with a portion of the flex board broken away to more clearly show its position with respect to the air permeable platen.
Figure 2:
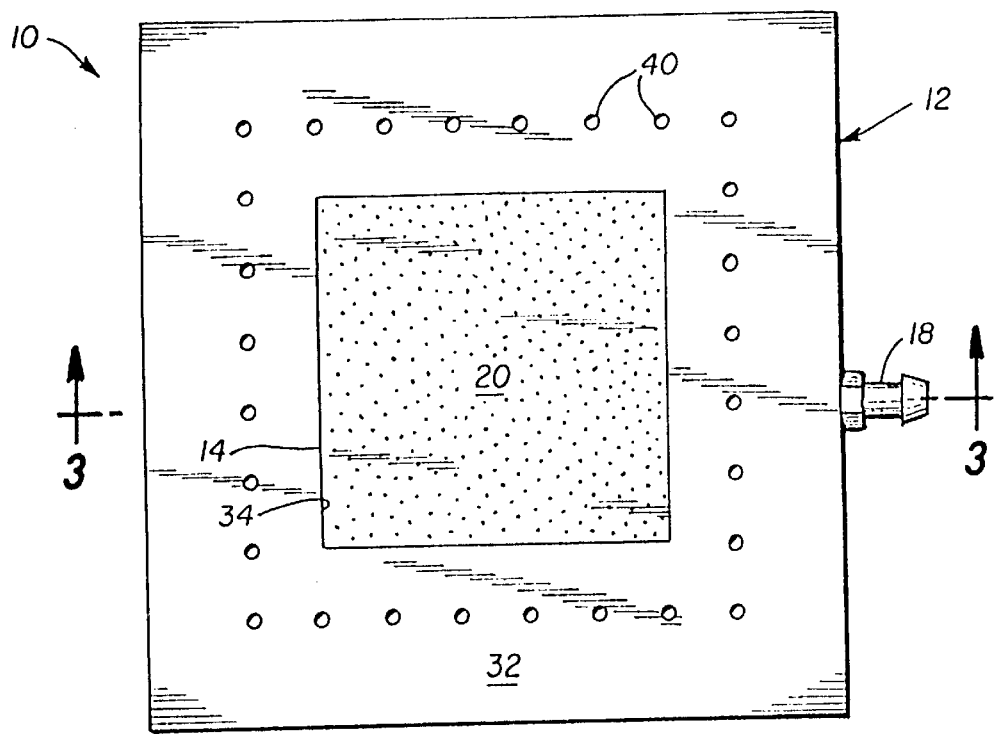
FIG. 2 is a plan view of the apparatus shown in FIG. 1 but without the flex board.
Figure 3:
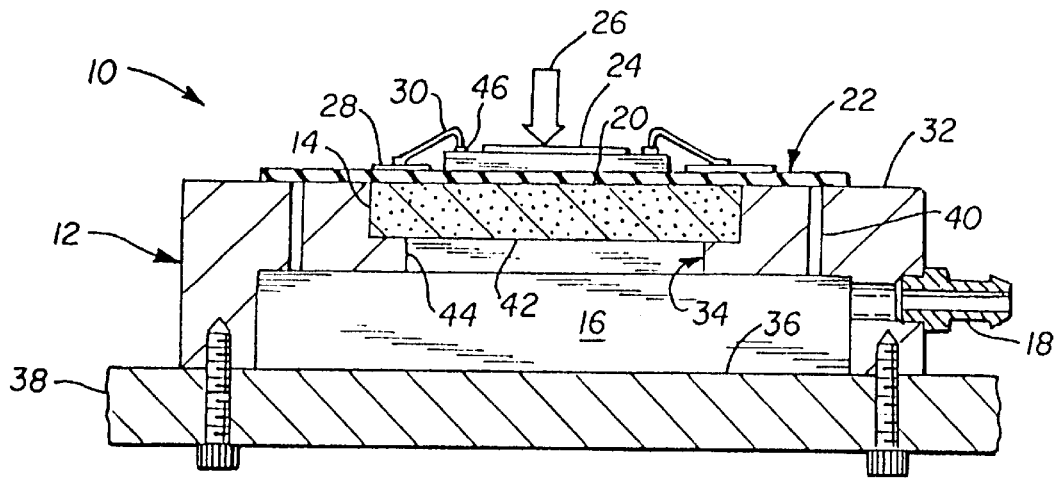
FIG. 3 is a sectional view in elevation of the apparatus for releasibly securing a flexible printed wiring board taken along the line 3—3 of FIG. 2.

Apparatus 10 for releasibly securing a flexible printed wiring board or flex board 22 in preparation for electrically connecting an electronic component 24 thereto is best seen in FIGS. 1, 2, and 3 and comprises a base plate 12 adapted to receive an air permeable platen 14. A vacuum chamber 16 interior to the base plate 12 (FIG. 3) is connected to a suitable vacuum source, such as a vacuum pump (not shown) via a vacuum port 18. The vacuum pump (not shown) reduces the pressure in the vacuum chamber 16, thus causing air pressure 26 external to the flex board 22 to securely hold the flex board 22 against the flat front surface 20 of the air permeable platen 14. A wire bonding machine (not shown) may then be used to electrically connect the electronic component 24 to the various conductors 28 on the flex board 22 by a plurality of fine wires 30.

A significant advantage of the present invention is that it securely holds the flex board 22 with respect to the wire bonding machine (not shown) during the entire wire bonding process without requiring adhesives, which can be inconvenient and difficult to remove. Another advantage is that the air permeable platen 14 evenly distributes the pressure differential between the vacuum chamber 16 and air exterior to the base plate 12, thus allowing the external air pressure 26 to hold the flex board 22 flat against the front surface 20 of air permeable platen 14 without the danger of parts of the flex board 22 lifting or wrinkling. After the wire bonding process is complete, the board 22 may be easily removed by simply removing the vacuum within vacuum chamber 16.

The details of the apparatus 10 are best seen by referring to FIGS. 2 and 3. Essentially, base plate 12 may be any shape, such as rectangular or square, to allow the base plate to be conveniently mounted to a suitable support structure 38 (FIG. 3) associated with a conventional wire bonding machine (not shown). Base plate 12 comprises a flat working surface 32 within which is positioned a central aperture 34 that is sized to receive the air permeable platen 14. The central aperture 34 is open to an internal vacuum chamber 16 that is defined between the base plate 12 and the surface 36 of support structure 38. The vacuum chamber 16 is connected to a suitable vacuum source, such as a vacuum pump (not shown) via vacuum port 18. Base plate 12 may also include a plurality of apertures or holes 40 spaced around the perimeter of air permeable platen 14. Each hole 40 connects the vacuum chamber 16 with the flat working surface 32. The holes 40 provide additional vacuum hold-down force to the flex board 22 to help hold down the portions of the flex board 22 that are not being worked on by the wire bonding machine. While the sizes of the holes 40 are not particularly critical, holes 40 having diameters of about 1/16 inch work well. Also, while the base plate 12 may be made from any air-impermeable material, such as metal or plastic, in one preferred embodiment the base plate 12 may be machined from a single block of aluminum.

The air permeable platen 14 comprises a flat front surface 20 and a back surface 42 and is mounted within the central aperture 34 of base plate 12 so that the flat front surface 20 is substantially co-planar with the flat working surface 32 of base plate 12, as best seen in FIG. 3. In one preferred embodiment, the air permeable platen 14 is supported by a mounting boss 44 integral to central aperture 34. In most applications, it will not be necessary to further secure the platen 14 to the mounting boss 44, although a suitable adhesive, such as the heat resistant epoxy known as Ablestik #84-1 LMI, available from Ablestik Corp. of 5670 N. 74th Place, Scottsdale, Ariz. 85253, may be used if it is desired to more securely hold the platen 14 within the central aperture 34 of base plate 12. The size and shape of the air permeable platen 14 should be sufficient so that it can support the entire area of the flex board 22 that is to be wire bonded.

The air permeable platen 14 may comprise any air permeable material, such as a sintered metal or ceramic material. In one preferred embodiment, the air permeable platen 14 comprises an air permeable ceramic material known generically as "airstone," one type of which is available from Eaton Products International of 2388 Cole Street, Birmingham, Mich. 48009 under the brand name "EP." While airstone is available with a wide range of pore diameters, e.g., from about 15 microns to about 175 microns or more, airstone having a pore diameter of about 40 microns provides a good balance between air permeability and surface smoothness. The air permeable platen 14 should also be sufficiently thick to withstand the expected pressure loads and wire bonding loads without significant deformation. For example, higher pressure and wire bonding loads will generally require a thicker air permeable platen 14, as would be obvious to persons having ordinary skill in the art. In one preferred embodiment, the air permeable platen 14 is about 0.25 inches thick.

In order to wire bond an electronic component, such as an integrated circuit 24, to the flex board 22 using the apparatus 10 shown and described above, the integrated circuit 24 is first bonded to the flex board 22 by any suitable means, such as, for example, by an organic adhesive. The flex board 22 is then placed on the working surface 32 of base plate 12 so that the integrated circuit 24 is positioned over the flat front surface 20 of air permeable platen 14, as best seen in FIGS. 1 and 3. A suitable vacuum source, such as a vacuum pump (not shown), connected to the vacuum port 18 is then used to lower the pressure in the vacuum chamber 16, which causes external air pressure 26 to urge the flex board 22 firmly against the flat front surface 20 of air permeable platen 14. While the particular pressure differential required between the vacuum chamber 16 and the ambient air is not particularly critical, the pressure differential must be sufficient to securely hold the flex board 22 flat against the surface 20 of air permeable platen 14 without danger that the flex board 22 will lift or wrinkle. In one preferred embodiment, the air pressure in the vacuum chamber 16 is maintained at about 15 inches of water during the entire wire bonding process.

Any of a number of well-known wire bonding processes may be used to electrically connect the integrated circuit 24 to the conductors 28 of the flex board 22. For example, the wires may be bonded by thermocompression bonding, ultrasonic or wedge-wedge bonding, or by thermosonic bonding, just to name a few. While the foregoing wire bonding processes are well-known in the art and are documented in numerous technical references such as, for example, *Electronic Materials Handbook, Volume 1-Packaging*, (ASM International, Materials Park, Ohio 44073, 1989), pp. 224–236, which is hereby incorporated by reference, a brief description of each process follows in the interest of providing additional background for the invention.

Thermocompression bonding is accomplished by bringing the wire 30 and the bonding pad 46 (or the conductor 28 on flex board 22) into intimate contact during a controlled time, temperature and pressure cycle. In one example of a thermocompression wire bonding process, a gold wire is threaded through a heated capillary on the wire bonding machine. The heated capillary may be maintained at a temperature of about 350° C. A ball is then formed on the end of the wire by either an electronic discharge or a hydrogen flame. Surface tension causes a ball to form on the end of the wire, which is then brought in contact with the heated bonding pad 46. The weld is effected by applying vertical pressure to the ball and wire. The capillary is then raised and repositioned over the appropriate conductor 28 on the flex board 22 and the wire bonded thereto by deforming the wire with pressure from the heated capillary. A wire clamp within the wire bonding machine is then closed, and the capillary and wire raised, thereby breaking the wire at the heel of the second bond. The process is then repeated for each connection.

Ultrasonic or wedge-wedge bonding is a low-temperature process in which the source of energy for the metal welding is a transducer vibrating the bonding tool or wedge at an ultrasonic frequency, usually in the range of 20 to 60 kHz. In the ultrasonic process, the wire is threaded through a hole in the wedge and trailed under the bonding tip. The bonding tool is positioned over the first bond site with the wire protruding under and somewhat beyond the front of the wedge. The wedge is lowered and the wire is pressed tightly between the wedge and the first bond site. A burst of ultrasonic energy is then applied to the wedge which, in combination with the pressure, welds the wire to the pad. The wedge is moved over to the second bond site, lowered and ultrasonic energy is again applied to the wedge, thus bonding the wire to the second bond site. The wedge is then rocked slightly to weaken the wire at the heel of the second bond and a clamp inside the wedge is then closed and the wedge raised, separating the wire from the bond.

The thermosonic bonding process combines ultrasonic energy with the ball bonding capillary technique of thermocompression bonding. The thermosonic process is performed in a manner analogous to the thermocompression process, except the capillary is not heated and the bonding pads are held between about 100–150° C.

Regardless of the particular wire bonding process that is selected, the apparatus 10 according to the present invention securely holds the flex board 22 flat with respect to the wire bonding machine so that the wire bonding process can be accomplished in the same manner as for rigid substrates. Once the wire bonding process is complete, the vacuum chamber 16 may be disconnected from the vacuum source (not shown), which removes the pressure differential and allows the flex board 22 to be removed.

Figure 4:
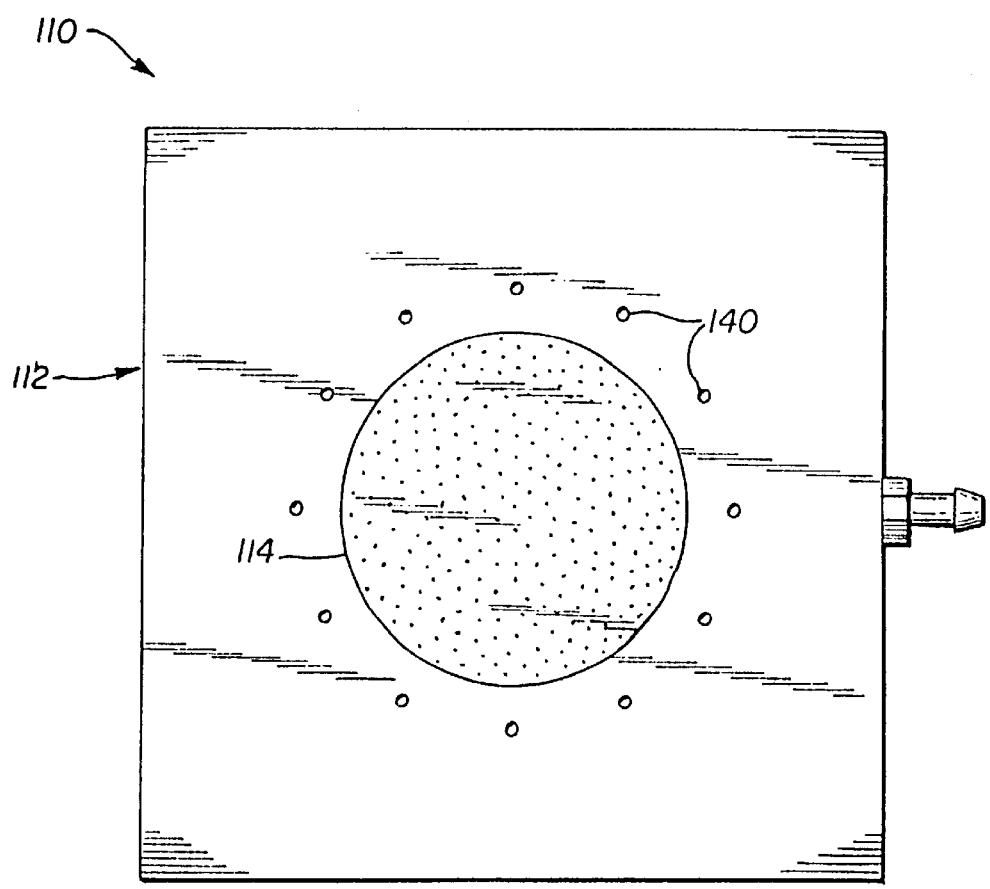
FIG. 4 is a plan view of another embodiment of the apparatus for releasibly securing a flexible printed wiring board.

Other embodiments are possible depending on the specific shape or configuration of the wiring board to be wire bonded. For example, another embodiment 110 is shown in FIG. 4 includes a circular air permeable platen 114 mounted to a rectangular or square base plate 112. As was the case for the first embodiment, base plate 112 may include a plurality of holes 140 spaced around the perimeter of the circular air permeable platen 114 to provide additional vacuum holding force to a printed wiring board (not shown) placed thereon.

It is contemplated that the inventive concepts herein described may be variously otherwise embodied and it is intended that the appended claims be construed to include alternative embodiments of the invention except insofar as limited by the prior art.

What is claimed is:

1. A method of electrically connecting an electronic component to a flexible printed wiring board, comprising the steps of:

providing an air permeable platen within a base plate, said base plate comprising a plurality of apertures spaced around a perimeter of said air permeable platen;

placing the flexible printed wiring board on a front surface of said air permeable platen and on a front surface of said base plate over said plurality of apertures;

producing a lower pressure at a back surface of said air permeable platen than at the front surface of said air permeable platen and producing a vacuum pressure through said plurality of apertures in said base plate so that air pressure holds the flexible printed wiring board to the front surface of said air permeable platen and the front surface of said base plate; and electrically connecting the electronic component to the flexible printed wiring board.

2. The method of claim 1, wherein the electronic component is electrically connected to the flexible printed wiring board by a wire bonding process.

3. The method of claim 2, wherein the wire bonding process comprises thermocompression bonding.

4. The method of claim 2, wherein the wire bonding process comprises ultrasonic bonding.

5. The method of claim 2, wherein the wire bonding process comprises thermosonic bonding.

* * * * *